United States Patent
Li et al.

(10) Patent No.: US 11,189,648 B2
(45) Date of Patent: Nov. 30, 2021

(54) ARRAY SUBSTRATE AND DISPLAY DEVICE

(71) Applicant: BOE Technology Group Co., Ltd., Beijing (CN)

(72) Inventors: Pan Li, Beijing (CN); Hongfei Cheng, Beijing (CN); Xinyin Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/472,932

(22) PCT Filed: Sep. 14, 2018

(86) PCT No.: PCT/CN2018/105749
§ 371 (c)(1),
(2) Date: Jun. 24, 2019

(87) PCT Pub. No.: WO2019/114349
PCT Pub. Date: Jun. 20, 2019

(65) Prior Publication Data
US 2019/0355765 A1  Nov. 21, 2019

(30) Foreign Application Priority Data
Dec. 14, 2017 (CN) .......................... 201721748967.3

(51) Int. Cl.
*H01L 27/12* (2006.01)
*H01L 23/522* (2006.01)

(52) U.S. Cl.
CPC ...... *H01L 27/1255* (2013.01); *H01L 23/5223* (2013.01); *H01L 27/124* (2013.01)

(58) Field of Classification Search
None
See application file for complete search history.

(56) References Cited

U.S. PATENT DOCUMENTS 9,082,665 B2 * 7/2015 Du .................. G02F 1/13452
10,504,931 B2 * 12/2019 Zhou .................. H01L 21/768
2007/0285370 A1 12/2007 Kim
(Continued)

FOREIGN PATENT DOCUMENTS

CN 102315211 A 1/2012
CN 203721714 U 7/2014
(Continued)

OTHER PUBLICATIONS

International Search Report and Written Opinion dated Nov. 22, 2018 for PCT/CN2018/105749 (Year: 2018).*
(Continued)

*Primary Examiner* — Telly D Green
(74) *Attorney, Agent, or Firm* — Arent Fox LLP; Michael Fainberg

(57) ABSTRACT

This disclosure relates to an array substrate and a display device. The array substrate includes a display area and a lead area, the display area including a plurality of signal lines, and the lead area including fanout lines connected with the signal lines, wherein the lead area further includes capacitance adjustment sections non-electrically connected with at least one of the fanout lines, the capacitance adjustment sections are at a layer different from a layer where at least one of the fanout lines is.

14 Claims, 4 Drawing Sheets

(56) References Cited

U.S. PATENT DOCUMENTS

2014/0291846 A1* 10/2014 Chai ................... G02F 1/1345
                                                    257/749
2019/0212855 A1* 7/2019 Shang ............... G02F 1/136286
2019/0355765 A1   11/2019 Li et al.

FOREIGN PATENT DOCUMENTS

CN    105204248 A     12/2015
CN    207781596 U  *  8/2018  .......... H01L 27/124
CN    207781596 U     8/2018

OTHER PUBLICATIONS

International Search Report dated Nov. 22, 2018 for PCT/CN2018/105749.

* cited by examiner

ARRAY SUBSTRATE AND DISPLAY DEVICE

This application is a National Stage of International Application No. PCT/CN2018/105749, filed on Sep. 14, 2018, which claims the priority of Chinese Patent Application No. 201721748967.3, filed with the Chinese Patent Office on Dec. 14, 2017, and entitled "An array substrate and a display device", both of which are hereby incorporated by reference in their entireties.

FIELD

This disclosure relates to the field of display technologies, and particularly to an array substrate and a display device.

BACKGROUND

Existing display panels generally include a Thin Film Transistor Liquid Crystal Display (TFT-LCD), an Organic Light-Emitting Diode Display (OLED), etc. An array substrate is an important component in each of their structures.

SUMMARY

Embodiments of this disclosure provide an array substrate and a display device in the following particular solutions.

Some embodiments of this disclosure provide an array substrate including a display area and an lead area, the display area including a plurality of signal lines, and the lead area including fanout lines connected with the signal lines, wherein the lead area further includes capacitance adjustment sections non-electrically connected with at least one of the fanout lines, the capacitance adjustment sections are at a layer different from a layer where at least one of the fanout lines is.

Optionally, there are overlapping areas between orthographic projections of the capacitance adjustment sections, and orthographic projections of the fanout lines in a direction perpendicular to the array substrate.

Optionally, there is an overlapping area between orthographic projections of at least a part of the capacitance adjustment section, and an orthographic projection of one of the fanout lines in the direction perpendicular to the array substrate.

Optionally, the array substrate further includes a binding area, the fanout lines are connected with the binding area, each of the capacitance adjustment sections includes a start end and a termination end, and distances between start ends of the capacitance adjustment sections and a boundary of the display area are identical, or distances between termination ends of the capacitance adjustment sections and the binding area are identical.

Optionally, there are overlapping areas between orthographic projections of at least a part of the capacitance adjustment sections, and orthographic projections of at least two of the fanout lines in the direction perpendicular to the array substrate.

Optionally, shapes of the capacitance adjustment sections are at least one of an ellipse and a polygon.

Optionally, overlapping areas between the capacitance adjustment sections and the at least two fanout lines are different.

Optionally, overlapping areas between the capacitance adjustment sections and at least two non-adjacent fanout lines are same.

Optionally, each of the fanout lines includes a first part and a second part, wherein there is an angle α between the first part and a first direction, and the second part extends in a second direction; the first parts of at least a part of the fanout lines are parallel to each other, and the second parts of at least a part of the fanout lines are parallel to each other; and the capacitance adjustment sections in a polygon shape include base angles of angle β, wherein α and β satisfy following equation: $45° \leq \alpha + \beta \leq 120°$.

Optionally, the capacitance adjustment sections are made of at least one of a metal, a metal alloy, or a transparent electrically-conductive material.

Optionally, the capacitance adjustment section are not electrically connected with any other electrically-conductive layer.

Optionally, overlapping areas between the fanout lines at the boundary of the fanout line area, and the capacitance adjustment sections are smaller than overlapping areas between the fanout lines at an interior of the fanout line area, and the capacitance adjustment sections.

Optionally, each of the fanout lines further includes a serpentine leading section, and there are overlapping areas between the orthographic projections of the capacitance adjustment sections, and orthographic projections of serpentine outlet sections in the direction perpendicular to the array substrate.

Optionally, longer lengths of the serpentine leading sections are, larger the overlapping areas between the serpentine leading sections and the capacitance adjustment sections are.

Optionally, the signal lines include at least one of gate lines, data lines, common electrode lines, or power supply lines.

Some embodiments of this disclosure further provides a display device including the array substrate according to any one of the solutions above.

DETAILED DESCRIPTION OF THE EMBODIMENTS

Figure 1:
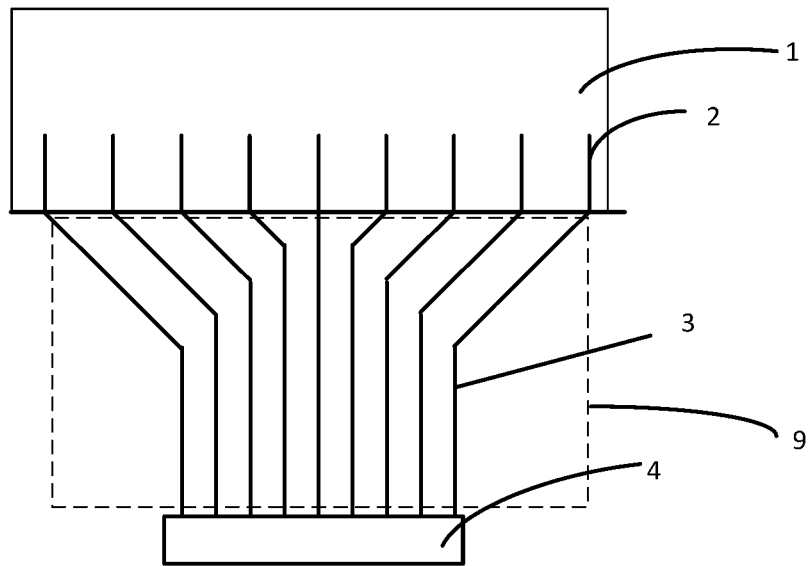
FIG. 1 is a schematic structural diagram of an arrangement pattern of fanout lines in a lead area in the related art.

FIG. 1 is a schematic structural diagram of an array substrate in the related art, where the array substrate includes a display area 1, a lead area 9, a binding area 4, etc. The display area 1 includes signal lines 2, the lead area 9 includes fanout lines 3 connected with the signal lines 2, and since the lengths of the fanout lines 3 at different outlet positions are different, there are different resistances and capacitances of the respective fanout lines 3, so there are different errors of signals transmitted over the different fanout lines 3, thus degrading the display effect of the display panel as a whole.

In view of this, some embodiments of this disclosure provide an array substrate and a display device so as to improve or address the problem in the related art that the capacitances of the fanout lines of the signal lines cannot be adjusted as needed in the array substrate or the display device, thus improving the display effect of the display device.

The technical solutions according to embodiments of this disclosure will be described below clearly and fully with reference to the drawings in the embodiments of this disclosure, and apparently the embodiments to be described below are only a part but not all of the embodiments of this disclosure. Based upon the embodiments here of this disclosure, all the other embodiments which can occur to those ordinarily skilled in the art without any inventive effort shall fall into the claimed scope of this disclosure.

For the sake of a convenient description of the respective embodiments of this disclosure, a first direction and a second direction in the specification will be defined as follows: the x direction in the drawings is the direction parallel to a side of the display area, and defined as the first direction, and the y direction is the direction perpendicular to the x direction, and defined as the second direction.

Unless stated otherwise, the sizes and shapes of respective layers in the drawings will not reflect any real proportion, but are only intended to illustrate this disclosure. In an array substrate according to some embodiments of this disclosure, capacitance adjustment sections are further arranged at the positions of fanout lines in the existing array substrate, where the capacitance adjustment sections are arranged at a different layer from the fanout lines so that the capacitances of the fanout lines can be adjusted as needed to thereby improve the display effect of a display panel as a whole. A particular structure of the array substrate will be described below in details.

Figure 2:
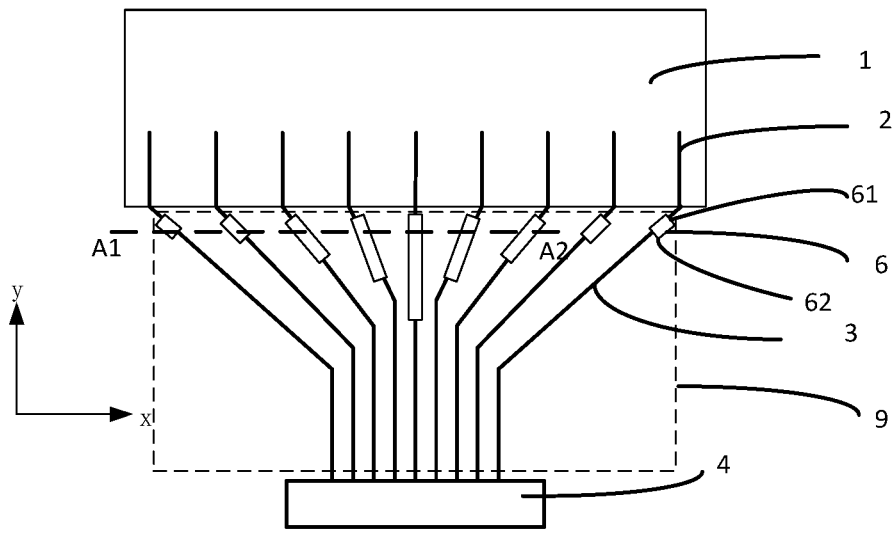
FIG. 2 is a schematic structural diagram of an array substrate according to some embodiments of this disclosure in a top view.

As illustrated in FIG. 2, an array substrate according to some embodiments of this disclosure includes a display area 1 for displaying an image, and a peripheral area outside the display area 1. The display area 1 includes a plurality of pixel elements arranged in a matrix, and signal lines 2 configured to provide signals to the pixel elements. The signal lines 2 can be gate lines, data lines, common electrode lines, power supply lines, etc. The peripheral area includes a lead area 9, and a binding area 4 connected with the lead area 9. The lead area 9 includes a plurality of fanout lines 3, each of which has one end connected with one of the signal lines 2 in the display area 2, and the other end connected with a binding pin in the binding area 4, where the fanout lines 3 are configured to transmit the signals from the binding area to the signal lines 2 in the display area. Capacitance adjustment sections 6 are arranged above or below (above in this embodiment, for example) the fanout lines 3. There are overlapping areas between an orthographic projection of the capacitance adjustment section 6 and an orthographic projection of the fanout line 3 in the direction perpendicular to the array substrate.

In some embodiment, there are different lengths of the fanout lines corresponding to the respective signal lines, and as illustrated in FIG. 2, for example, the lengths of the fanout lines 3 are decreasing gradually, and the lengths of the capacitance adjustment sections 6 are increasing gradually, from the boundary of the fanout line area 9 to the inside thereof (for example, the lead area 9 extends in the X direction). Mutual capacitances between the fanout lines in the lead area 9, and their adjacent fanout lines are positively correlated to the lengths of the fanout lines, that is, the longer the fanout lines are, the larger the mutual capacitance thereof are. Capacitors between the capacitance adjustment section 6 and the fanout lines 3 will be referred briefly to as adjustment capacitors. Of course, the capacitances of the adjustment capacitors are positively correlated to overlapping areas between the capacitance adjustment sections 6 and the fanout lines 3, that is, the adjustment capacitances are increasing gradually from the boundary of the fanout line area 9 to the inside thereof so that the sums of the mutual capacitances and the adjustment capacitances of the respective fanout lines 3 are substantially uniform, to the effect of adjusting the capacitances of the fanout lines.

Optionally, the capacitance adjustment sections 6 correspond to the fanout lines 3 in a one-to-one manner, and the capacitance adjustment sections 6 extend in the same direction as the fanout lines. Straight distances between start ends 61 of the capacitance adjustment sections, and the boundary of the display area, i.e., their distances in the second direction, remain uniform.

Figure 3:
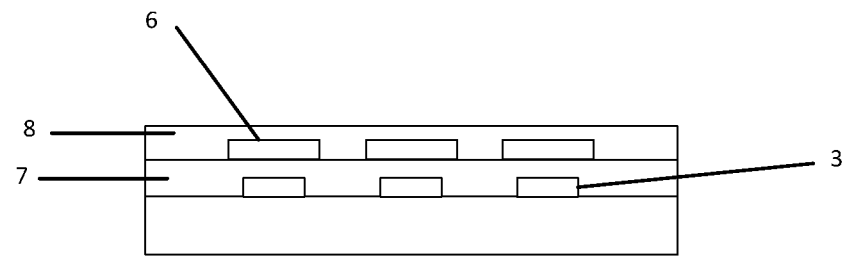
FIG. 3 is a schematic diagram of the array substrate in FIG. 2 in a sectional view along A1A2.

FIG. 3 is a schematic diagram of the array substrate in FIG. 2 in a sectional view along A1A2, and as illustrated, a pattern of the fanout lines 3 is formed on a substrate, a first insulation layer 7 is deposited on the patterns of the fanout lines 3, a pattern of the capacitance adjustment sections 6 is formed on the first insulation layer 7, and a second insulation layer 8 is deposited on the capacitance adjustment sections 6. Optionally, the pattern of the fanout lines 3 can include a structure of one or more layers including the gate layer, the source-drain layer, or any metal or transparent electrically-conductive layer; the pattern of the capacitance adjustment sections 6 can be formed of a source-drain layer, a gate layer, or any other metal or transparent electrically-conductive layer as long as the pattern of the fanout lines is formed at a different layer as the pattern of the capacitance adjustment sections; the first insulation layer 7 can include one or more of a gate insulation layer, a passivation layer, a semiconductor layer, a planarization layer, etc.; and the second insulation layer 8 can include one or more of the gate insulation layer, the passivation layer, the semiconductor layer, the planarization layer, etc. The orthographic projections of the capacitance adjustment sections 6, and the orthographic projections of the fanout lines 3 in the direction perpendicular to the array substrate can partially overlap with each other, or can or completely overlap with each other (that is, the orthographic projections of the capacitance adjustment sections 6 in the direction perpendicular to the array substrate completely cover the orthographic projections of the fanout lines 3 in the direction perpendicular to the array substrate) for the technical effect of this disclosure.

Figure 4:
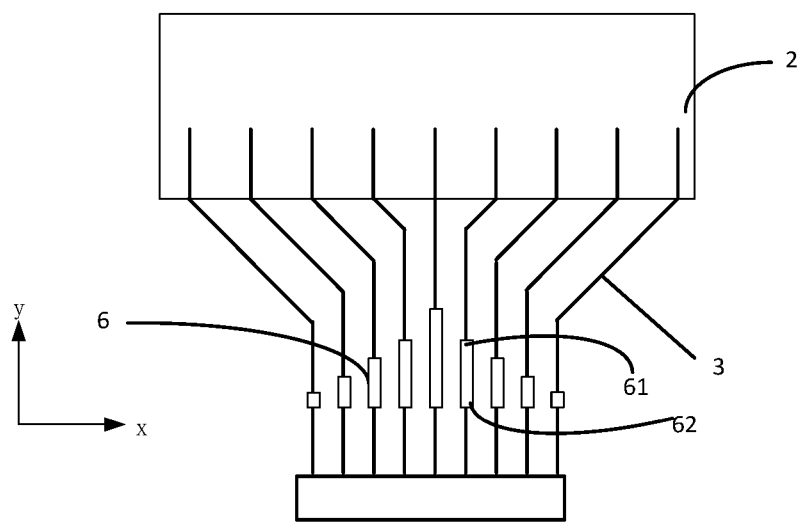
FIG. 4 is a schematic structural diagram of a second array substrate according to some embodiments of this disclosure in a top view.

In another embodiment of this disclosure as illustrated in FIG. 4, straight distances between termination ends 62 of the capacitance adjustment sections 6, and the binding area, i.e., their distances in the second direction, remain uniform. Extension lines of longer sides of the respective capacitance adjustment sections are parallel to each other.

Figure 5:
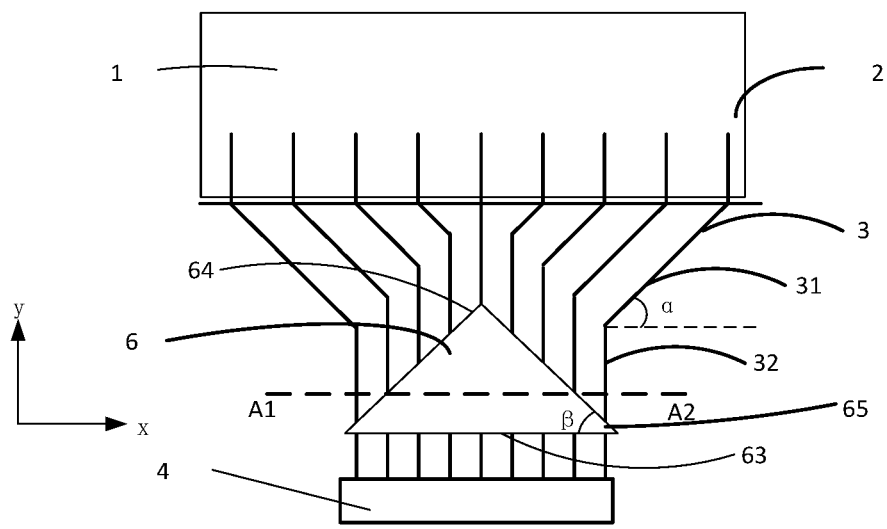
FIG. 5 is a schematic structural diagram of a third array substrate according to some embodiments of this disclosure in a top view.

In another embodiment of this disclosure as illustrated in FIG. 5, there are overlapping areas between the orthographic projections of the capacitance adjustment sections 6, and orthographic projections of at least two fanout lines in the direction perpendicular to the array substrate. Optionally, the area of orthographic projections of the capacitance adjustment sections 6 in the direction perpendicular to the array substrate are not exactly the same as the area of the orthographic projections of the at least two fanout lines in the direction perpendicular to the array substrate. Of course, the area of the orthographic projections of the capacitance adjustment sections 6 in the direction perpendicular to the array substrate can alternatively be the same as the area of the orthographic projections of the at least two fanout lines in the direction perpendicular to the array substrate.

For example, the capacitance adjustment sections 6 are triangularly structured. Of course, they can alternatively be in another shape, e.g., an ellipse, a round, or a polygon, e.g., a pentagon, a diamond, etc., without departing from the scope of this disclosure. The capacitance adjustment sections 6 are arranged at a different layer from the fanout lines 3, and there are overlapping areas between the orthographic projections of the capacitance adjustment sections 6 in the direction perpendicular to the array substrate, and orthographic projections of more than two fanout lines in the direction perpendicular to the array substrate. In some embodiments, one sides 63 of the capacitance adjustment sections 6 are proximate to the binding area 4, and for example, parallel to the longer side of the binding area 4, and orthographic projections of corners 64 thereof facing the sides 63 overlap with a orthographic projection of the shortest fanout line in the direction perpendicular to the array substrate.

Here each fanout line includes a first part 31 and a second part 32, where there is an angle $\alpha$ between the first part 31 and the first direction, and the second part 32 extends in the second direction. The respective first parts 31 of the respective fanout lines 31 are arranged parallel to each other, and the second parts 32 thereof are arranged parallel to each other. There is an angle $\beta$ of base corners 65 of the capacitance adjustment sections 6, where $\alpha$ and $\beta$ satisfy the following equation: $45°\leq\alpha+\beta\leq120°$. There will be a better capacitance adjustment effect when $\alpha+\beta\approx90°$. The base corner 65 refers to an inner corner defined by the side 63 of each capacitance adjustment section 6 proximate to the binding area 4, and the side adjacent thereto.

Figure 6:
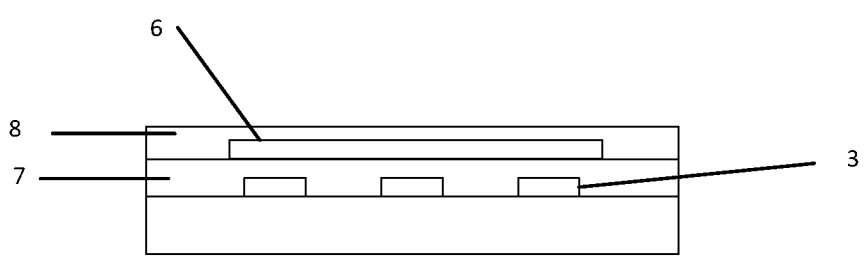
FIG. 6 is a schematic diagram of the array substrate in FIG. 5 in a sectional view along A1A2.

FIG. 6 is a schematic diagram of the array substrate in FIG. 5 in a sectional view along A1A2. As illustrated, the pattern of the fanout lines 3 is formed on the substrate, the first insulation layer 7 is deposited on the pattern of the fanout lines, the pattern of the capacitance adjustment sections 6 is formed on the first insulation layer 7, and the second insulation layer 8 is deposited on the capacitance adjustment sections 6, where the pattern of the gate lines 3 can be formed of a gate layer, a source-drain layer, or any other metal layer; the pattern of the capacitance adjustment sections 6 can be formed of the source-drain layer, the gate layer, or any other metal layer as long as the pattern of the gate lines 3 is formed at a different layer as the pattern of the capacitance adjustment sections 6; the first insulation layer 7 can include one or more of a gate insulation layer, a passivation layer, a semiconductor layer, a planarization layer, etc.; and the second insulation layer 8 can include one or more of the gate insulation layer, the passivation layer, the semiconductor layer, the planarization layer, etc. The orthographic projections of the capacitance adjustment sections 6, and the orthographic projections of the fanout lines 3 in the direction perpendicular to the array substrate can partially overlap with each other, or can or completely overlap with each other (that is, the orthographic projections of the capacitance adjustment sections 6 in the direction perpendicular to the array substrate completely cover the orthographic projections of the fanout lines 3 in the direction perpendicular to the array substrate) for the technical effect of this disclosure.

Figure 7:
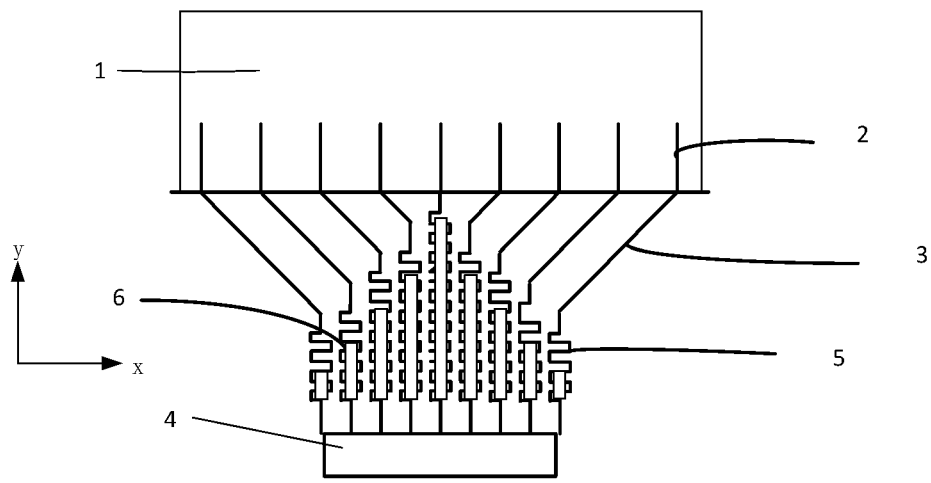
FIG. 7 is a schematic structural diagram of a fourth array substrate according to some embodiments of this disclosure in a top view.

FIG. 7 is a schematic diagram of an array substrate according to another embodiment of this disclosure. The array substrate according to this embodiment includes a display area 1 for displaying an image, and a peripheral area. The display area 1 includes a plurality of pixel elements arranged in a matrix, and signal lines 2 configured to provide the pixel elements with signals. The signal lines 2 can be gate lines, data lines, common electrode lines, power supply lines, etc. The peripheral area includes a lead area 9, and a binding area 4 connected with the lead area 9. The lead area 9 includes a plurality of fanout lines 3, each of which has one end connected with one of the signal lines 2 in the display area, and the other end connected with a binding pin in the binding area 4, where the fanout lines 3 are configured to transmit the signals from the binding area to the signal lines 2 in the display area. The fanout lines 3 include serpentine leading sections 5 configured to adjust impedances of the respective fanout lines so that the impedances of the respective fanout lines 3 remain uniform, but there are still different mutual capacitances of the respective fanout lines. Capacitance adjustment sections 6 are arranged above or below (above in this embodiment, for example) the serpentine leading sections 5. Each capacitance adjustment section 6 corresponds to only one of the serpentine leading sections 5, and there are overlapping areas between orthographic projections of the capacitance adjustment section 6, and orthographic projections of the serpentine leading sections 5 in the direction perpendicular to the array substrate. The lengths of the capacitance adjustment section 6 increase with the increasing lengths of the fanout lines including the serpentine leading sections 5. Typically the serpentine leading sections 5 at the center of the lead area 9 are longer, and the serpentine leading sections 5 at the boundary of the lead area 9 are shorter; and correspondingly the capacitance adjustment section 6 at the center of the leading area 9 are longer, and the capacitance adjustment section 6 at the boundary of the lead area 9 are shorter.

Figure 8:
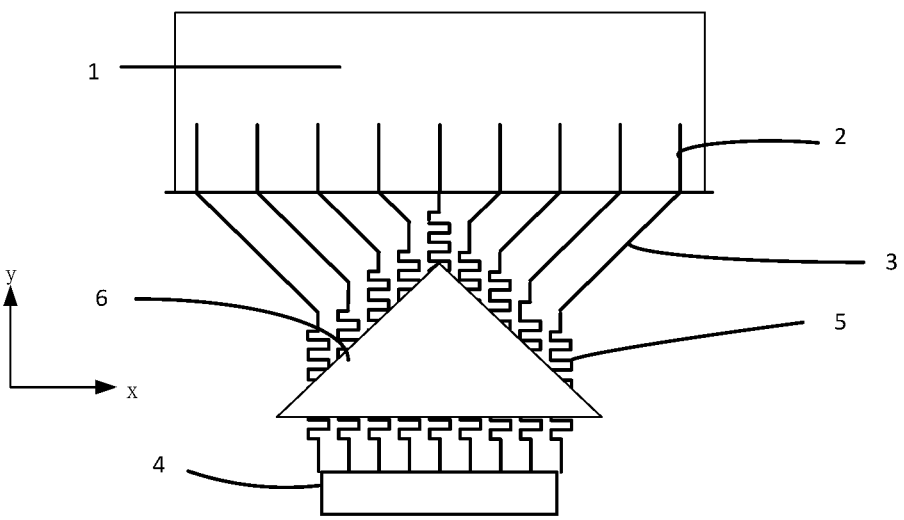
FIG. 8 is a schematic structural diagram of a fifth array substrate according to some embodiments of this disclosure in a top view.

FIG. 8 is a schematic diagram of an array substrate according to another embodiment of this disclosure. The array substrate according to this embodiment includes a display area 1 for displaying an image, and a peripheral area. The display area 1 includes a plurality of pixel elements arranged in a matrix, and signal lines 2 configured to provide the pixel elements with signals. The signal lines 2 can be gate lines, data lines, common electrode lines, power supply lines, etc. The peripheral area includes a lead area 9, and a binding area 4 connected with the lead area 9. The lead area 9 includes a plurality of fanout lines 3, each of which has one end connected with one of the signal lines 2 in the display area, and the other end connected with a binding pin in the binding area 4, where the fanout lines 3 are configured to transmit the signals from the binding area to the signal lines 2 in the display area. The fanout lines 3 include serpentine leading sections 5. Capacitance adjustment sections 6 are arranged above or below (above in this embodiment, for example) the serpentine leading sections 5. The capacitance adjustment sections 6 are triangular in shape. Of course, they can alternatively be in another shape, e.g., an ellipse, a round, or a polygon, e.g., a pentagon, a diamond, etc., without departing from the scope of this disclosure. There are overlapping areas between orthographic projections of the capacitance adjustment sections 6 in the direction perpendicular to the array substrate, and orthographic projections of at least two serpentine leading sections 5 in the direction perpendicular to the array substrate. The lengths of the fanout lines including the serpentine leading sections 5 are positively correlated to the overlapping areas between the capacitance adjustment sections 6 and the serpentine leading sections 5, that is, the longer the fanout lines including the serpentine outlet sections 5 are, the overlapping areas between the capacitance adjustment sections 6 and the serpentine leading sections 5 are larger; and the shorter the fanout lines including the serpentine leading sections 5 are, the overlapping areas between the capacitance adjustment sections 6 and the serpentine leading sections 5 are smaller. With this design, there will be uniform mutual capacitances of the respective fanout lines, thus improving the display effect of the display panel as a whole.

Furthermore, it shall be noted that the drawings in embodiments of this disclosure are only optional schematic structural diagrams, but not intended to limit this disclosure thereto.

In a particular implementation, each array substrate includes other layers or structures in addition to the signal lines, the fanout lines, etc., and for example, further include thin film transistors, common electrodes, pixel electrodes, etc., all of which can be arranged as needed, although embodiments of this disclosure will not be limited thereto.

Based upon the same inventive idea, some embodiments of this disclosure further provide a display device including the array substrate above according to any one of the embodiments above of this disclosure. Reference can be made to the array substrate above according to any one of the embodiments above of this disclosure for an implementation of the display device, so a repeated description thereof will be omitted here.

In summary, in the array substrate and the display device according to the embodiments of this disclosure, the lead area of the signal lines includes the capacitance adjustment sections arranged at a different layer from the fanout lines; and in embodiments of this disclosure, the capacitance adjustment sections are arranged to adjust the capacitances of the fanout lines as needed, thus improving the display effect of the display panel as a whole.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. An array substrate, comprising a display area, a lead area and a binding area, the display area comprising a plurality of signal lines, and the lead area comprising fanout lines connected with the signal lines, wherein the lead area further comprises a plurality of capacitance adjustment sections non-electrically connected with at least one of the fanout lines, the capacitance adjustment sections are at a layer different from a layer where at least one of the fanout lines is;

wherein the plurality of capacitance adjustment sections correspond to the fanout lines in an one-to-one manner, and all of the plurality of capacitance adjustment sections are closer to the binding area; the plurality of capacitance adjustment sections are separated from each other without an electrical connection; all of the plurality of capacitance adjustment sections form a pattern, the pattern only overlaps with second parts of the fanout lines, the second parts are perpendicular to a side of the display area;

wherein orthographic projections of at least a part of the plurality of the capacitance adjustment sections overlap with an orthographic projection of one of the fanout lines in a direction perpendicular to the array substrate.

2. The array substrate according to claim 1, wherein the fanout lines are connected with the binding area, each of the capacitance adjustment sections comprises a start end and a termination end, and distances between start ends of the capacitance adjustment sections and a boundary of the display area are identical, or distances between termination ends of the capacitance adjustment sections and the binding area are identical.

3. The array substrate according to claim 1, wherein shapes of the capacitance adjustment sections are at least one of an ellipse and a polygon.

4. The array substrate according to claim 1, wherein overlapping areas between the capacitance adjustment sections and the at least two fanout lines are different.

5. The array substrate according to claim 1, wherein overlapping areas between the capacitance adjustment sections and at least two non-adjacent fanout lines are same.

6. The array substrate according to claim 3, wherein each of the fanout lines comprises a first part and a second part, wherein there is an angle α between the first part and a first direction, and the second part extends in a second direction; the first parts of at least a part of the fanout lines are parallel to each other, and the second parts of at least a part of the fanout lines are parallel to each other; and the capacitance adjustment sections in a polygon shape comprise base angles of angle β, wherein α and β satisfy following equation: $45°≤α+β≤120°$.

7. The array substrate according to claim 1, wherein the capacitance adjustment sections are made of at least one of a metal, a metal alloy, or a transparent electrically-conductive material.

8. The array substrate according to claim 1, wherein the capacitance adjustment section are not electrically connected with any other electrically-conductive layer.

9. The array substrate according to claim 1, wherein overlapping areas between the fanout lines at the boundary of the fanout line area, and the capacitance adjustment sections are smaller than overlapping areas between the fanout lines at an interior of the fanout line area, and the capacitance adjustment sections.

10. The array substrate according to claim 1, wherein each of the fanout lines further comprises a serpentine leading section, and there are overlapping areas between the orthographic projections of the capacitance adjustment sections, and orthographic projections of serpentine outlet sections in the direction perpendicular to the array substrate.

11. The array substrate according to claim 10, wherein longer lengths of the serpentine leading sections are, larger the overlapping areas between the serpentine leading sections and the capacitance adjustment sections are.

12. The array substrate according to claim 1, wherein the signal lines comprise at least one of gate lines, data lines, common electrode lines, or power supply lines.

13. A display device, comprising the array substrate according to claim 1.

14. The array substrate according to claim 1, wherein areas of a part of the pattern closer to the binding area are greater than areas of a part of the pattern closer to the display area.

* * * * *